US009024197B2

(12) United States Patent
Zhou et al.

(10) Patent No.: US 9,024,197 B2
(45) Date of Patent: May 5, 2015

(54) PATTERNED TRANSPARENT CONDUCTIVE FILM

(71) Applicant: Nanchang O-Film Tech. Co., Ltd., Jiangxi (CN)

(72) Inventors: Fei Zhou, Jiangxi (CN); Miaoqian Cao, Jiangxi (CN); Yulong Gao, Jiangxi (CN); Yun Fang, Jinagxi (CN)

(73) Assignee: Nanchang O-Film Tech. Co., Ltd., Jiangxi (CN)

( * ) Notice: Subject to any disclaimer, the term of this patent is extended or adjusted under 35 U.S.C. 154(b) by 110 days.

(21) Appl. No.: 13/968,905

(22) Filed: Aug. 16, 2013

(65) Prior Publication Data

US 2014/0216785 A1 Aug. 7, 2014

Related U.S. Application Data

(63) Continuation of application No. PCT/CN2013/078928, filed on Jul. 5, 2013.

(30) Foreign Application Priority Data

Feb. 5, 2013 (CN) .......................... 2013 1 0045974

(51) Int. Cl.
H05K 1/00 (2006.01)
H05K 1/09 (2006.01)
H05K 1/02 (2006.01)
H05K 3/10 (2006.01)

(52) U.S. Cl.
CPC .............. *H05K 1/0274* (2013.01); *H05K 3/107* (2013.01); *H05K 2201/09681* (2013.01)

(58) Field of Classification Search
CPC ....... G06F 3/041; G06F 3/047; H05K 1/0298; H05K 1/0274; H05K 2201/0338
USPC .......................................... 174/250, 255, 257
See application file for complete search history.

(56) References Cited

U.S. PATENT DOCUMENTS

| 2013/0056244 | A1* | 3/2013 | Srinivas et al. ................ 174/250 |
| 2013/0182405 | A1* | 7/2013 | Kaufman ......................... 362/19 |
| 2013/0299214 | A1* | 11/2013 | Frey et al. ...................... 174/253 |
| 2014/0151098 | A1* | 6/2014 | Hwang et al. .................. 174/257 |
| 2014/0246225 | A1* | 9/2014 | Mizuno et al. ................ 174/255 |
| 2015/0002760 | A1* | 1/2015 | Morimoto et al. .............. 349/12 |

* cited by examiner

*Primary Examiner* — Hoa C Nguyen
(74) *Attorney, Agent, or Firm* — Rosenberg, Klein & Lee

(57) ABSTRACT

A patterned transparent conductive film is disclosed in the present invention, which includes a substrate, a first conductive layer, a second conductive layer, both the conductive layer includes a conductive area and an insulating area, the conductive area includes a metal mesh formed by a plurality of metal lines; the metal mesh is a buried metal mesh with random irregular grids, a probability density of the slope of the metal lines of the first conductive layer close to transverse direction is greater than that close to longitudinal direction, a probability density of the slope of the metal lines of the second conductive layer close to transverse direction is greater than that close to longitudinal direction, the two conductive layers are laminated and insulated in the thickness direction, the laminated metal meshes are evenly distributed, the light transmittance is increased and the conductivity is constant, the moire fringe is eliminated.

11 Claims, 9 Drawing Sheets

PATTERNED TRANSPARENT CONDUCTIVE FILM

This application is a continuation application of an International Application No. PCT/CN2013/078928, filed on Jul. 5, 2013, entitled "PATTERNED TRANSPARENT CONDUCTIVE FILM", which claims the priority from a Chinese patent application No. 201310045974.7, filed on Feb. 5, 2013, entitled "PATTERNED TRANSPARENT CONDUCTIVE FILM", the disclosures for which are hereby incorporated herein in their entireties by reference.

FIELD OF THE INVENTION

The present disclosure relates to a field of conductive film, more particularly relates to a patterned transparent conductive film.

BACKGROUND OF THE INVENTION

The transparent conductive film is a type of conductive film having good electrical conductivity and high light transmittance in the visible wavelengths. Currently, the transparent conductive film has been widely used in fields of flat panel displays, photovoltaic devices, touch panels and electromagnetic shielding and others, which has an extremely wide market space.

In the conventional mobile phone touch screen, in order to reduce the thickness and weight of the mobile phone, a flexible patterned transparent conductive film is mostly used; the top and bottom electrodes composed by two pieces of transparent conductive films are needed to perform the function of touch in general touch screen. However, when the two pieces of transparent conductive films are combined, the light transmittance can further decrease. The conductive area of the two pieces of conventional transparent conductive films is usually regular mesh, the cyclical distribution of regular black lines are deposited between the pixels due to the LCD pixel cell is regular rectangular cell, the cyclical opaque lines of the conductive film and the black lines of the LCD cooperatively form a cyclical shelter, such that a significant moire fringe appears when this kind of transparent conductive film is bonded to the surface of the LCD. Moreover, base on the same principle, the significant moire fringe appears when two regular meshed conductive films are bonded to each other. This phenomenon has a serious impact on the application of the patterned transparent conductive film with metal mesh.

SUMMARY OF THE INVENTION

The present disclosure is directed to provide a patterned transparent conductive film which can eliminate the phenomenon of moire fringe.

According to an aspect of the present disclosure, a patterned transparent conductive film is provided, which including:

a substrate having a first surface and a second surface opposite to the first surface;

a first conductive layer disposed on the first surface of the substrate, the first conductive layer comprising a first conductive area and a first insulating area, the first conductive area comprising a first metal mesh consisting of a plurality of first metal lines; and a second conductive layer comprising a second conductive area and a second insulating area, the second conductive area comprising a second metal mesh consisting of a plurality of second metal lines;

wherein both the first metal mesh and the second metal mesh are buried metal mesh with random irregular grids, a probability density of the slope of the first metal lines close to a transverse direction is greater than a probability density of the slope of the first metal lines close to a longitudinal direction, a probability density of the slope of the second metal lines close to the longitudinal direction is greater than a probability density of the slope of the second metal lines close to the transverse direction, the second conductive layer and the first conductive layer are laminated one another and spaced from each other in the thickness direction for insulating, angles of the metal grid lines of a laminated metal mesh formed in the lamination of the first and second conductive layers are evenly arranged.

In one embodiment, the lamination of the random irregular grids of the first conductive layer and the second conductive layer follows the following condition: the metal lines of the laminated metal mesh are straight, with angle cooperatively formed by the metal lines and the direction X directing right horizontally are evenly arranged, being evenly arranged means: angle $\theta$ of each of the metal lines is measured, a probability $p_i$ representing the probability of the lines with angle $\theta$ in one of continuous angle intervals with a step of 5° is measured, thereby $p_1, p_2, \ldots$ to $p_{36}$ of 36 angle intervals from 0 to 180° is obtained, the standard deviation of $p_i$ being less than 20% of the arithmetic deviation thereof.

In one embodiment, the probability density of the first metal lines in the first conductive area with slope $K_1$ in the range of $(-1, 1)$ is greatest of all, the probability density of the second metal lines in the second conductive area with slope $K_2$ in the range of $(-\infty, -1) \cup (1, +\infty)$ is greatest of all.

In one embodiment, the second conductive layer is deposited on the second surface of the substrate and opposite to the first conductive layer.

In one embodiment, the second conductive layer is deposited on the first conductive layer, and arranged at the same side of the substrate as the first conductive layer.

In one embodiment, the first insulating area and the second insulating area comprise a third metal mesh consisting of a plurality of third metal lines, the first insulating area and the first conductive area are insulated from each other, the second insulating area and the second conductive area are insulated from each other, the third metal mesh consists of random irregular grids.

In one embodiment, the third metal mesh of the first insulating area and the second insulating area are evenly arranged in each angle.

In one embodiment, the third metal lines of the first insulating area are connected to each other, but disconnected from the first metal lines of the first conductive area; the third metal lines of the second insulating area are connected to each other, but disconnected from the second metal lines of the second conductive area.

In one embodiment, the third metal mesh of the first insulating area and the second insulating area consist of the third lines without connecting point and disconnected from each other.

In one embodiment, a minimum distance of adjacent ends of every two disconnected lines of the third lines, without connecting point and disconnected from each other, is less than 30 μm.

In one embodiment, a difference of transmittance between the first conductive area and the first insulating area is less than 2%, a difference of transmittance between the second conductive area and the second insulating area is less than 2%.

In the patterned transparent conductive film, a first metal mesh of the first conductive layer is stretched and intercepted in longitudinal direction, the second metal mesh of the second conductive layer is stretched and intercepted in transverse direction, thereby a probability density of the slope of the first metal lines close to transverse direction is greater than that close to longitudinal direction, a probability density of the slope of the second metal lines close to transverse direction is greater than that close to longitudinal direction, and the area of the first metal mesh and the second metal mesh (i.e. light transmittance area) is increased, thereby the light transmittance of the transparent conductive film is increased, moreover, the probability density of the metal lines close to the direction is constant due to the stretch and interception are in a single direction, such that the conductivity of the patterned transparent conductive film can remain basically constant, besides the probability densities of the metal lines of the first conductive layer and the second conductive layer are different in the same direction, such that after the first conductive layer and the second conductive layer are laminated, the laminated meshes of the whole conductive film are evenly distributed in each angle.

DETAILED DESCRIPTION OF THE EMBODIMENTS

Figure 1:
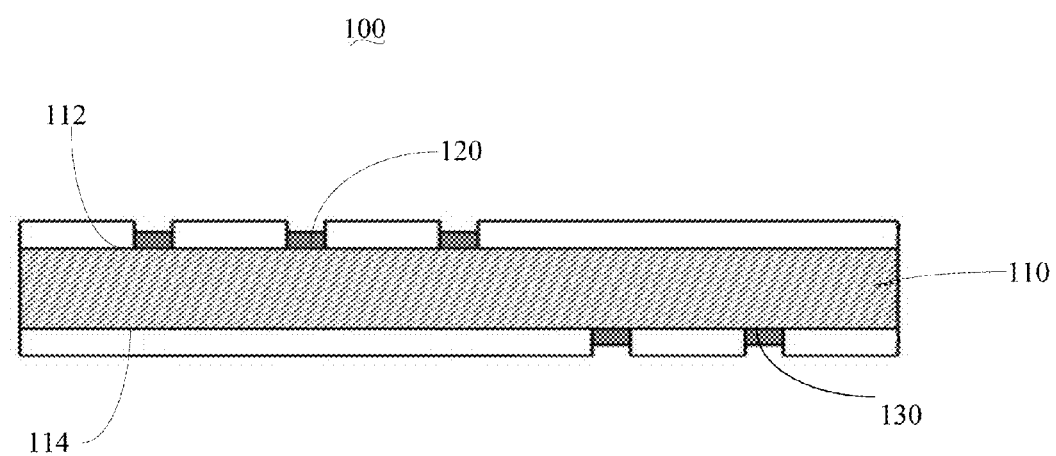
FIG. 1 is a schematic, cross-sectional view of a patterned transparent conductive film.
Figure 2:
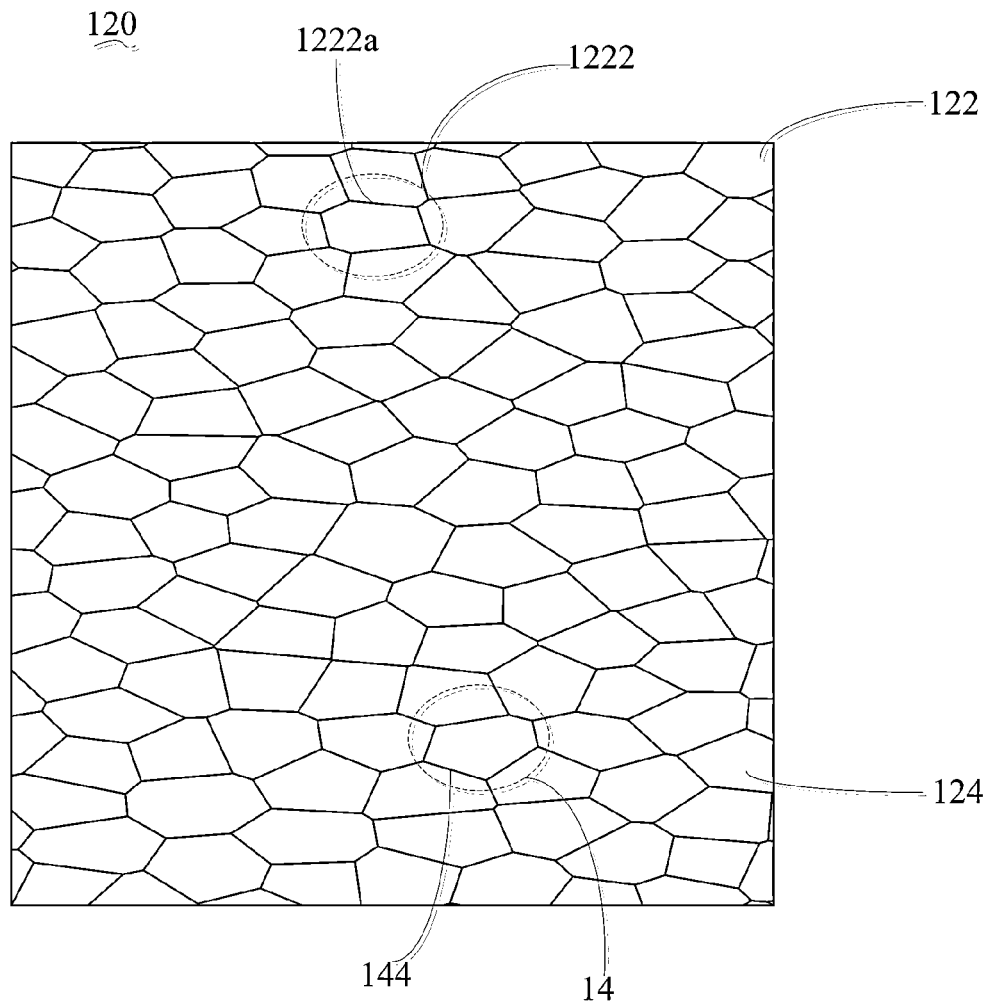
FIG. 2 is a partial, schematic view of a mesh with random grids of a first conductive layer of the patterned transparent conductive film.

Reference will now be made to the drawings to describe, in detail, embodiments of the present patterned transparent conductive film.

Referring to FIG. 1, FIG. 2, FIG. 3 and FIG. 4, an embodiment of a patterned transparent conductive film 100 includes a substrate 110, a first conductive layer 120 and a second conductive layer 130. The substrate 110 includes a first surface 112 and a second surface 114 opposite to each other. The first conductive layer 120 is deposited on the first surface 112 of the substrate 110 and includes a first conductive area 122 and a first insulating area 124. The first conductive area 122 includes a first metal mesh 1222 consisting of a plurality of first metal lines 1222a; and a probability density of the slope of the first metal lines 1222a close to transverse direction is greater than a probability density of the slope of the first metal 1222a lines close to longitudinal direction. The second conductive layer 120 includes a second conductive area 132 and a second insulating area 134, the second conductive area 132 includes a second metal mesh 1322 formed by a plurality of second metal lines 1322a; and a probability density of the slope of the second metal lines 1322a close to transverse direction is greater than a probability density of the slope of the second metal lines 1322a close to longitudinal direction.

The first metal mesh 1222 and the second metal mesh 1322 are buried meshes, and the shapes of that are random irregular grids, a surface of the substrate 110 or a surface of a substrate layer is defined a groove, and then the groove is filled with metal, or coated and cured on the surface of the substrate 110 to form the crossed metal lines, and compacted to obtain the buried metal mesh.

The second conductive layer 130 and the first conductive 120 are laminated and at interval in the thickness direction of the substrate 110 for insulating, a plurality metal lines 142 of a laminated metal mesh 140 formed by laminating are evenly distributed in each angle.

In the patterned transparent conductive film 100, the plane of the substrate 110 is regarded as the coordinate plane, longitudinal direction is X axis, transverse direction is Y axis. The probability density of the slope of the first metal lines 1222a close to transverse direction is greater than a probability density of the slope of the first metal 1222a lines close to longitudinal direction, which means that the number of first metal lines 1222a of the first conductive area 122 close to the X-axis is greater than that close to the Y-axis. The probability density of the slope of the second metal lines 1322a close to transverse direction is greater than a probability density of the slope of the second metal lines 1322a close to longitudinal direction, which means that the number of second metal lines 1322a of the second conductive area 122 close to the X-axis is greater than that close to the Y-axis. The probability densities of the metal lines of the first conductive layer 120 and the second conductive layer 130 are different in the same direction, such that the laminated mesh of the whole conductive film are evenly distributed in each angle. The regular repetition of the mesh and the LCD mesh is avoided, the moire fringe is eliminated. In the illustrated embodiment, the random grids can be in a honeycomb arrangement.

Figure 5:
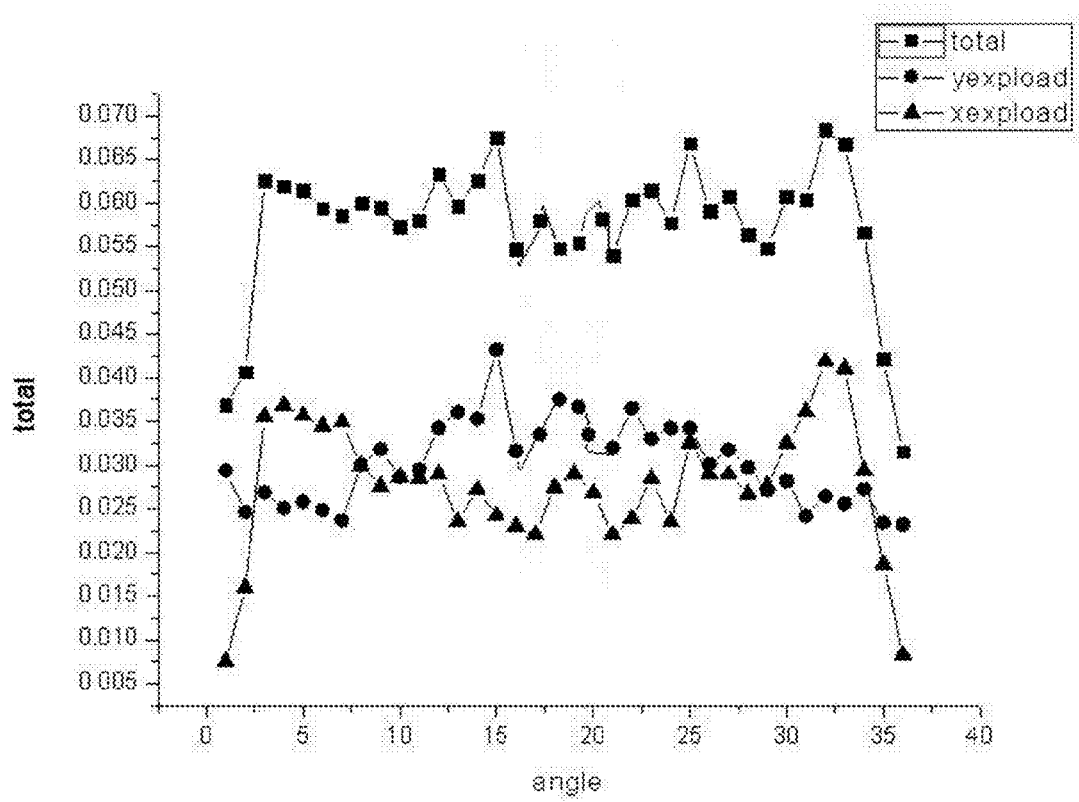
FIG. 5 is a chart showing a probability density of the random grids shown in FIG. 2 and FIG. 3 after laminating.

The probability density of the first conductive layer 120 and the second conductive layer 130 after laminating is shown as FIG. 5, referring to the FIG. 5, the probability density of the slope of the first metal lines 1222a close to transverse direction is greater than a probability density of the slope of the first metal 1222a lines close to longitudinal direction, the probability density of the slope of the second metal lines 1322a close to transverse direction is greater than a probability density of the slope of the second metal lines 1322a close to longitudinal direction, thus when the slope of the first metal lines 1222a is on the rise, the slope of the second lines 1322a is on the downward, after the first conductive layer 120 and the second conductive layer 130 are laminated, the scope of the laminated metal lines 142 is horizontal, the laminated metal mesh 140 of the whole conductive film are evenly distributed.

Figure 4:
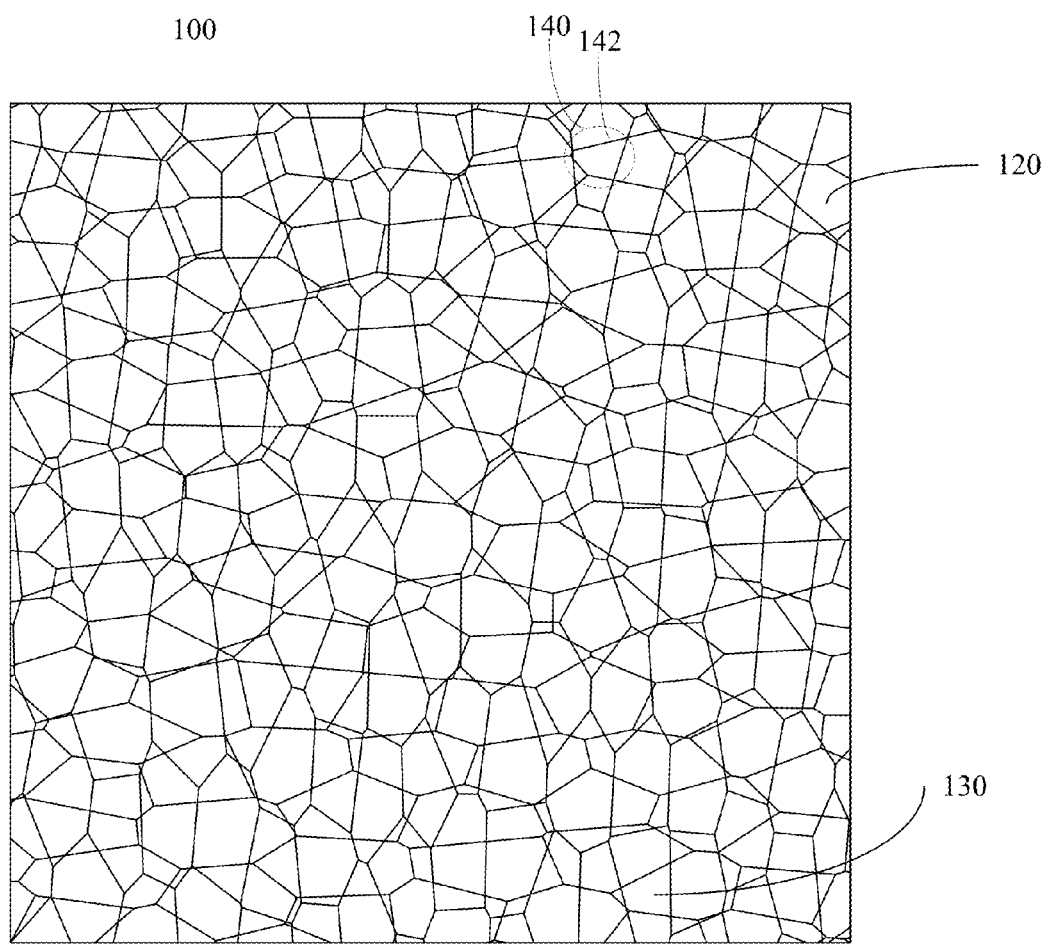
FIG. 4 is a partial, schematic view of the meshes shown in FIG. 2 and FIG. 3 after laminating.
Figure 6:
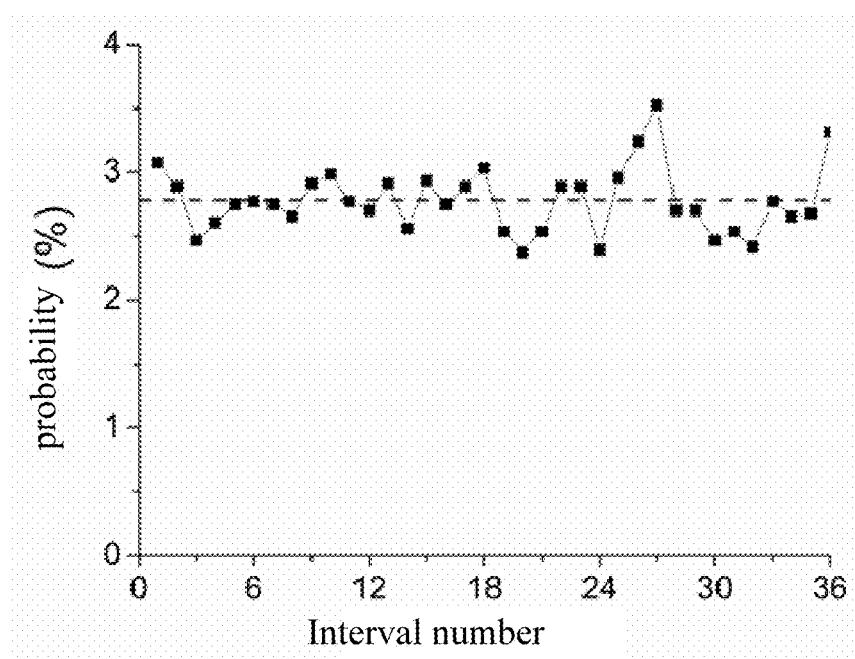
FIG. 6 is a chart showing a probability distribution $p_i$ of angles formed by each of the grid lines of the patterned transparent conductive film and the X axis.

Referring to FIG. 4 and FIG. 6, in the illustrated embodiment, the type of the random grids are isotropic irregular multilateral random grids, take the random grid with an area of 5 mm*5 mm as an example, the angular distribution of the metal lines 142 of the laminated metal mesh 140 is analyzed.

An embodiment is shown in FIG. 4, the random grids includes 4275 line segments. Each θ value cooperatively formed by each metal line and the X axis is measured to obtain one-dimensional array of θ(1) to θ(4257) and then according to an interval step of 5°, 0 to 180° is divided into 36 angle interval, a probability of the lines located in each angle interval is measured, an array of p(1) to p(36) is obtained, which is shown in FIG. 6.

Then according to the standard deviation formula:

$$s = \sqrt{\frac{(p_1 - p)^2 + (p_2 - p)^2 + \ldots (p_n - p)^2}{n}}$$

where n is 36, the standard deviation s is 0.26%, the average probability p is 2.78%. Thus s/p=9.35%, the lines of the random grids are distributed very evenly in the angle, the moire fringe can be effectively avoided. When the patterned transparent conductive film 100 described according to the embodiment is bonded to the surface of the LCD, the moire fringe does not appear.

Referring to FIG. 1, in the illustrated embodiment, the second conductive layer 130 is deposited on the second surface 114 of the substrate 110, and opposite to the first conductive layer 120. The substrate layer is imprinted to form a groove, and then the groove is filled with conductive material to form the first conductive layer 120 and the second conductive layer 130, and finally the prepared first conductive layer 120 and the second conductive layer 130 are produced on the first surface 112 and the second surface 114, respectively, the patterned transparent conductive film 100 is formed, which the random grids after laminating is distributed evenly in each angle. The substrate layer is a thermoplastic polymer layer. The visible light transmittance of the first conductive layer 120 and the second conductive layer 130 are both greater than the 88.6%. Of course, in alternative embodiments, the first conductive layer 120 and the second conductive layer 130 can be laminated on the same side of the substrate 110 and spaced from each other for insulating, which can satisfy different structure types of the conductive film, and thus can be applied to different structure types of the touch screen.

In the design of the mesh, the mesh for preparing the first conductive layer 120 is intercepted after being stretched in longitudinal direction direction, the mesh for preparing the second conductive layer 130 is intercepted after being stretched in transverse direction direction, the mesh having the same area as the mesh before the stretching is obtained, the conductive layer is photoetched according to the designed mesh; a mold is manufactured according to the photoetched pattern, and the conductive layer is imprinted by the mold to get the groove; the groove is filled with conductive material to obtain the a plurality of buried metal meshes. After the mesh is stretched, the area of a single metal mesh is increased, such that the light transmission of the obtained the first conductive layer 120 and the second conductive layer 130 have been increased. Moreover, a large number of the first metal lines 1222a of the first conductive layer 120 are located close to the X axis, a large number of the second metal lines 1322a of the second conductive layer 130 are located close to the Y axis. The more the metal lines close to a direction, the better the unilateral conductivity, the conductivity of the first conductive layer 120 close to the X axis is great, and the conductivity of the second conductive layer 130 close to the Y axis is great.

In the illustrated embodiment, the probability density of the first metal lines 1222a in the first conductive area 122 with slope $K_1$ in the range of (−1, 1) is greatest of all, The probability density of the second metal lines 1322a in the second conductive area 132 with slope $K_2$ in the range of (−∞, −1) ∪ (1, +∞) is greatest of all. The scope K=tan θ, the θ is an angle of the metal lines and the abscissa. According to the definition of the tan θ, tan 45°=1, tan −45°=−1, such that most of the angles of the first metal lines 1222a in the first conductive area 122 and the X axis is in the range of (−45°, 45°) or (225°, 315°), the end values is not included, i.e. the largest number of the metal lines is close to the X axis. Most of the metal lines are close to the X axis. Most of the first metal lines 1322a in the first conductive area 132 is in the range of (45°, 135°) or (−45°, −135°), the end values is not included, i.e. Most of the metal lines are close to the Y axis.

Figure 3:
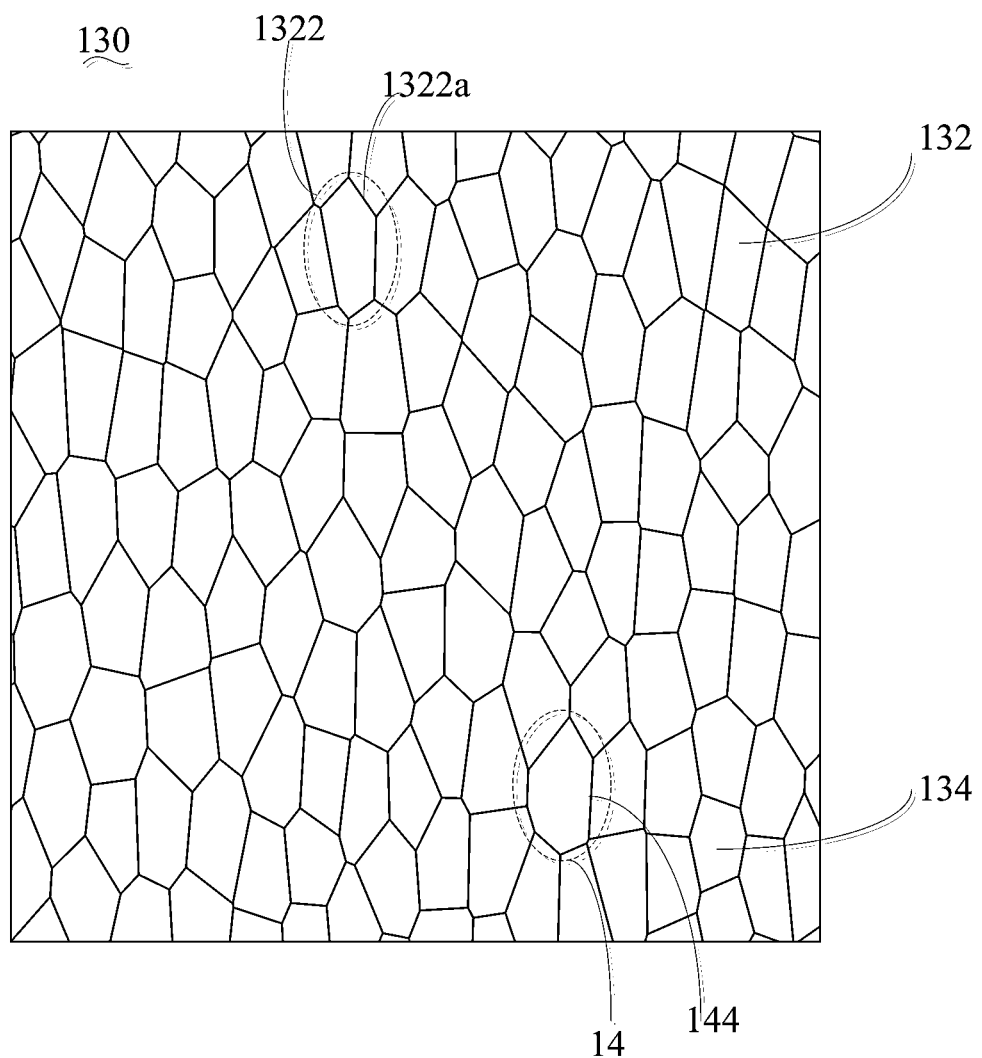
FIG. 3 is a partial, schematic view of a mesh with random grids of a second conductive layer of the patterned transparent conductive film.

Referring to FIG. 3, the greater the probability density of the first metal lines 1222a with the slope $K_1$ in the range of (−1, 1), i.e., the greater the number of the metal lines close to the X-axis, thus the better the conductivity in the X axis direction. In the illustrated embodiment, when the probability density of the first metal lines 1222a with the slope $K_1$ in the range of (−1, 1) is greatest of all, the greatest conductivity of the patterned transparent conductive film 100 is in the X axis direction. Referring to FIG. 4, when the probability density of the second metal lines 1322a with the slope $K_1$ in the range of (−1, 1) is greatest of all, the greatest conductivity of the patterned transparent conductive film 100 is in the Y axis direction. The visible light transmittance of the first conductive layer 120 and the second conductive layer 130 are both greater than 89.86%, the corresponding resistance in the X-axis and Y-axis direction is 58Ω, the visible light transmittance of the two laminated conductive layer after laminating is 87.6%, the visible light transmittance is increased.

Figure 7:
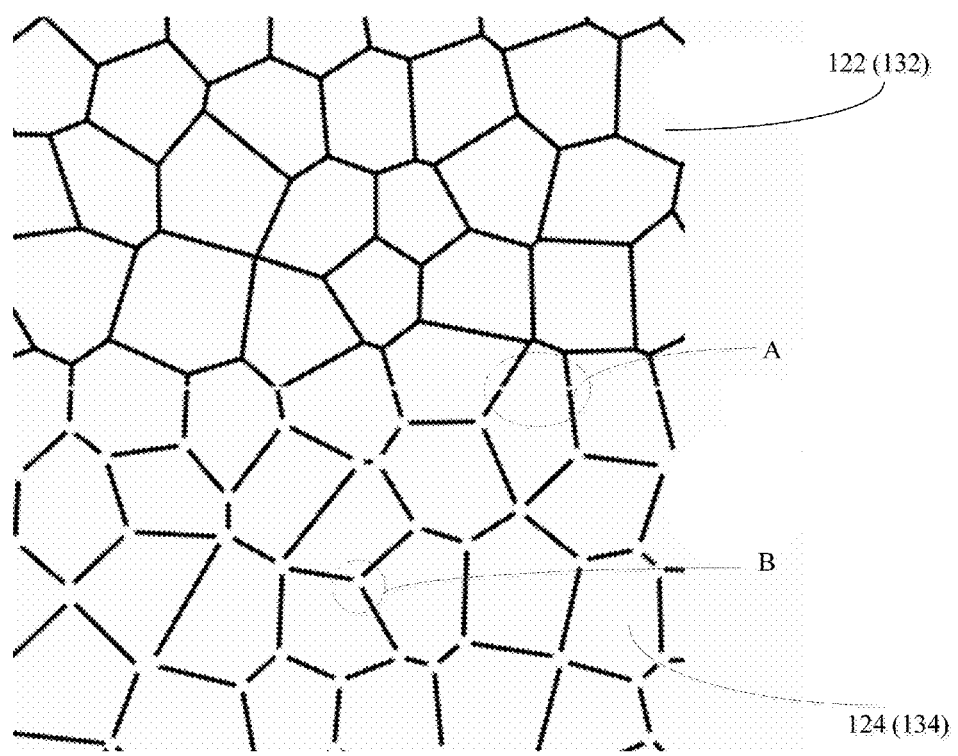
FIG. 7 is an enlarged, schematic view of the random mesh shown in FIG. 2 or FIG. 3.
Figure 7A:
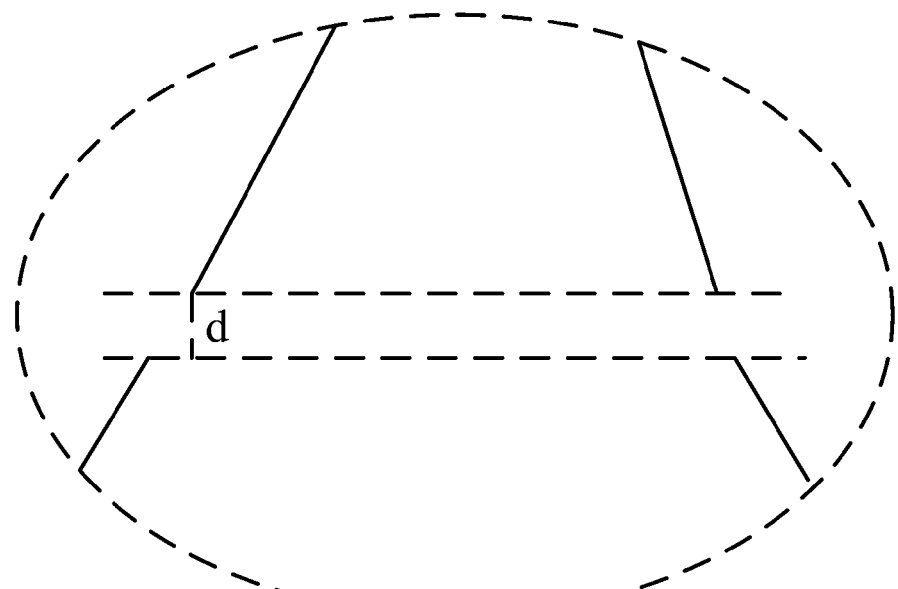
FIG. 7A is a partial, enlarged view of a circled portion A shown in FIG. 7.
Figure 7B:
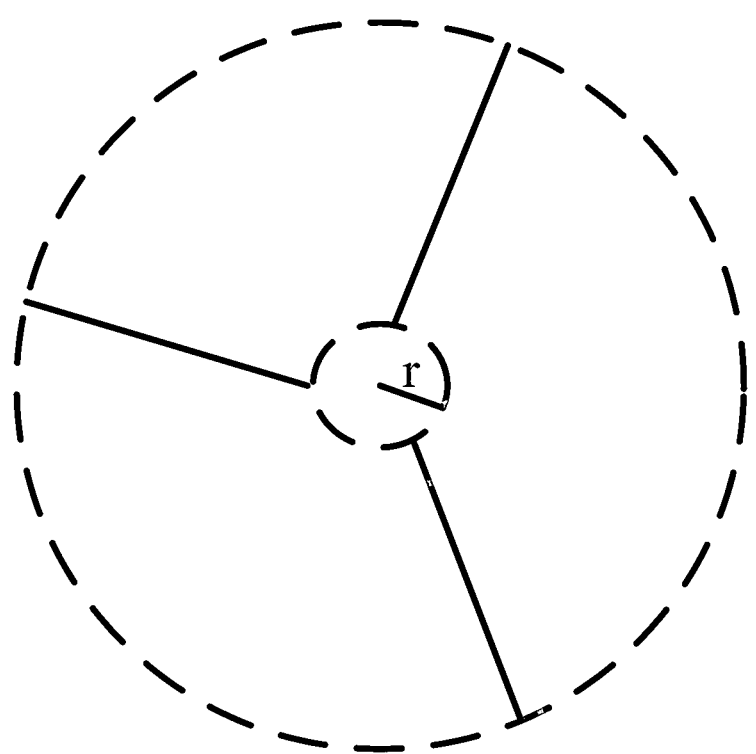
FIG. 7B is a partial, enlarged view of a circled portion B shown in FIG. 7.

Referring to FIG. 7, FIG. 7A and FIG. 7B, which show the third metal lines 144 of the third metal mesh 14 of the first insulating area 124 or the second insulating area 134, take the first insulating area 124 as an example, the second insulating area 134 is similar to the first insulating area 124, here no longer etc. The first insulating area 124 includes a third metal mesh 14 formed by the third metal lines 144, the third metal mesh 14 consists of random irregular grids, and a density of the third metal mesh 14 is the same as that of the first conductive area 122, the average diameter R of the third metal mesh 14 can be 120 μm, which can help reduce the phenomenon of the moire fringe. The first insulating area 124 is insulated to the first conductive area 122, in the illustrated embodiment, an insulation mode is: the first insulating area 124 and the third metal lines 144 are connected to each other, a blank area is provided between the first insulating area 124 and the first conductive area 122 to separate the first insulating area 124 and the first conductive area 122, the width d of the blank area can be 3 μm, after the test, the width is not visible for eye, which can satisfy the requirement of the transparency for eye, the grayscale contrast does not generate.

In the alternative embodiments, the third metal mesh 14 of the first insulating area 124 and the second insulating area 134 is evenly distributed in each angle. The difference of transmittance between the first conductive area 122 and the first insulating area 124 is less than 2%, the difference of transmittance between the second conductive area 132 and the second insulating area 124 is less than 2%. Therefore, a gray scale difference in visible does not appear in the conductive area and the insulating area located on the same conductive layer, the customer experience feeling has been improved.

In alternative embodiments, the insulation mode may be: the third metal mesh 14 of the first insulating area 124 is formed by a plurality of third lines 144 without connecting point and disconnected from each other. Specifically, each connecting point is regarded as a center; the groove structure is canceled below a radius r of 3 μm. Since the first insulating area 124 is formed by isolated third metal lines 144 disconnected from each other, the completely non-conductive can be achieved, the transmission of the first conductive area 122 is the same as that of the first insulating area 124; the gray contrast does not appear. In the illustrated embodiment, both the insulation modes are applied to the first insulating area of the first conductive layer 120 and the second conductive layer 130. The first conductive area 122 and the second conductive area 132 are produced to silver lines by screen printing; the drive electrode and the sensing electrode are formed when it is applied to the touch screen.

In the illustrated embodiment, a minimum distance of both endpoints of every two lines of the third lines 144 without connecting point and disconnected from each other is less than 30 μm. The conductive area and the insulating area can be guaranteed to not conductive to each other, besides, the gray change does not appear in the blank area of the insulating area; the impact of the operator's experience of feeling is avoided.

In these embodiments, the substrate 110 can be made of glass, quartz, polymethyl methacrylate, polycarbonate or the like, the conductive material is not limited to silver; it may be graphite, conductive polymer materials and the like.

It should be understood that the descriptions of the examples are specific and detailed, but those descriptions can not be used to limit the present disclosure. Therefore, the scope of protection of the patent should be subject to the appended claims.

What is claimed is:

1. A patterned transparent conductive film, comprising:
a substrate having a first surface and a second surface opposite to the first surface;
a first conductive layer disposed on the first surface of the substrate, the first conductive layer comprising a first conductive area and a first insulating area, the first conductive area comprising a first metal mesh consisting of a plurality of first metal lines; and
a second conductive layer comprising a second conductive area and a second insulating area, the second conductive area comprising a second metal mesh consisting of a plurality of second metal lines;
wherein both the first metal mesh and the second metal mesh are buried metal mesh with random irregular grids, a probability density of the slope of the first metal lines close to a transverse direction is greater than a probability density of the slope of the first metal lines close to a longitudinal direction, a probability density of the slope of the second metal lines close to the longitudinal direction is greater than a probability density of the slope of the second metal lines close to the transverse direction, the second conductive layer and the first conductive layer are laminated one another and spaced from each other in the thickness direction for insulating, angles of the metal grid lines of a laminated metal mesh formed in the lamination of the first and second conductive layers are evenly arranged.

2. The patterned transparent conductive film according to claim 1, wherein the lamination of the random irregular grids of the first conductive layer and the second conductive layer follows the following condition: the metal lines of the laminated metal mesh are straight, with angle θ cooperatively formed by the metal lines and the direction X directing right horizontally are evenly arranged, being evenly arranged means: angle θ of each of the metal lines is measured, a probability $p_i$ representing the probability of the lines with angle θ in one of continuous angle intervals with a step of 5° is measured, thereby $p_1, p_2, \ldots$ to $p_{36}$ of 36 angle intervals from 0 to 180° is obtained, the standard deviation of $p_i$ being less than 20% of the arithmetic deviation thereof.

3. The patterned transparent conductive film according to claim 1, wherein the probability density of the first metal lines in the first conductive area with slope $K_1$ in the range of $(-1, 1)$ is greatest of all, the probability density of the second metal lines in the second conductive area with slope $K_2$ in the range of $(-\infty, -1) \cup (1, +\infty)$ is greatest of all.

4. The patterned transparent conductive film according to claim 1, wherein the second conductive layer is deposited on the second surface of the substrate and opposite to the first conductive layer.

5. The patterned transparent conductive film according to claim 1, wherein the second conductive layer is deposited on the first conductive layer, and arranged at the same side of the substrate as the first conductive layer.

6. The patterned transparent conductive film according to claim 1, wherein the first insulating area and the second insulating area comprise a third metal mesh consisting of a plurality of third metal lines, the first insulating area and the first conductive area are insulated from each other, the second insulating area and the second conductive area are insulated from each other, the third metal mesh consists of random irregular grids.

7. The patterned transparent conductive film according to claim 6, wherein the third metal mesh of the first insulating area and the second insulating area are evenly arranged in each angle.

8. The patterned transparent conductive film according to claim 7, wherein the third metal lines of the first insulating area are connected to each other, but disconnected from the first metal lines of the first conductive area; the third metal lines of the second insulating area are connected to each other, but disconnected from the second metal lines of the second conductive area.

9. The patterned transparent conductive film according to claim 7, wherein the third metal mesh of the first insulating area and the second insulating area consist of the third lines without connecting point and disconnected from each other.

10. The patterned transparent conductive film according to claim 9, wherein a minimum distance of adjacent ends of every two disconnected lines of the third lines, without connecting point and disconnected from each other, is less than 30 μm.

11. The patterned transparent conductive film according to claim 1, wherein a difference of transmittance between the first conductive area and the first insulating area is less than 2%, a difference of transmittance between the second conductive area and the second insulating area is less than 2%.

* * * * *